US009754925B2

United States Patent
Tsai et al.

(10) Patent No.: US 9,754,925 B2
(45) Date of Patent: Sep. 5, 2017

(54) 3DIC INTERCONNECT APPARATUS AND METHOD

(71) Applicant: Taiwan Semiconductor Manufacturing Company, Ltd., Hsin-Chu (TW)

(72) Inventors: Shu-Ting Tsai, Kaohsiung (TW); Dun-Nian Yaung, Taipei (TW); Jen-Cheng Liu, Hsin-Chu (TW); U-Ting Chen, Wanluan Township (TW); Shih-Pei Chou, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/231,419

(22) Filed: Aug. 8, 2016

(65) Prior Publication Data

US 2016/0351546 A1    Dec. 1, 2016

Related U.S. Application Data

(63) Continuation of application No. 14/135,103, filed on Dec. 19, 2013, now Pat. No. 9,412,719.

(51) Int. Cl.
*H01L 23/48*    (2006.01)
*H01L 23/52*    (2006.01)
(Continued)

(52) U.S. Cl.
CPC .... *H01L 25/0657* (2013.01); *H01L 21/31051* (2013.01); *H01L 21/31111* (2013.01);
(Continued)

(58) Field of Classification Search
CPC ................ H01L 25/0657; H01L 25/50; H01L 21/31051; H01L 21/31111;
(Continued)

(56) References Cited

U.S. PATENT DOCUMENTS 4,956,312 A    9/1990   Van Laarhoven
6,111,319 A *   8/2000   Liou ................. H01L 21/76802
                                                                             257/751
(Continued)

FOREIGN PATENT DOCUMENTS

CN        102299133 A     12/2011
CN        102339813 A      2/2012
(Continued)

OTHER PUBLICATIONS

Quirk, Michael et al., "Semiconductor Manufacturing Technology," 2001, Prentice-Hall, Inc, Chapter 12, p. 300.

*Primary Examiner* — Sitaramarao S Yechuri
(74) *Attorney, Agent, or Firm* — Slater Matsil, LLP

(57) ABSTRACT

An interconnect apparatus and a method of forming the interconnect apparatus is provided. Two integrated circuits are bonded together. A first opening is formed through one of the substrates. A multi-layer dielectric film is formed along sidewalls of the first opening. One or more etch processes form one or more spacer-shaped structures along sidewalls of the first opening. A second opening is formed extending from the first opening to pads in the integrated circuits. A dielectric liner is formed, and the opening is filled with a conductive material to form a conductive plug.

20 Claims, 10 Drawing Sheets

(51) Int. Cl.
*H01L 25/065* (2006.01)
*H01L 25/00* (2006.01)
*H01L 23/00* (2006.01)
*H01L 21/768* (2006.01)
*H01L 21/3105* (2006.01)
*H01L 21/311* (2006.01)

(52) U.S. Cl.
CPC .. *H01L 21/76831* (2013.01); *H01L 21/76832* (2013.01); *H01L 21/76877* (2013.01); *H01L 21/76898* (2013.01); *H01L 23/481* (2013.01); *H01L 24/24* (2013.01); *H01L 24/80* (2013.01); *H01L 24/82* (2013.01); *H01L 24/91* (2013.01); *H01L 25/50* (2013.01); *H01L 21/76805* (2013.01); *H01L 2224/24051* (2013.01); *H01L 2224/24146* (2013.01); *H01L 2224/80895* (2013.01); *H01L 2224/80896* (2013.01); *H01L 2224/821* (2013.01); *H01L 2224/82031* (2013.01); *H01L 2224/92* (2013.01); *H01L 2224/9202* (2013.01); *H01L 2224/9212* (2013.01); *H01L 2224/94* (2013.01); *H01L 2225/06541* (2013.01); *H01L 2924/12036* (2013.01)

(58) Field of Classification Search
CPC ......... H01L 21/76831; H01L 21/76832; H01L 21/76877; H01L 21/76898; H01L 21/76805; H01L 23/481; H01L 24/24; H01L 24/80; H01L 24/82; H01L 24/91
See application file for complete search history.

(56) References Cited

U.S. PATENT DOCUMENTS

| | | | |
|---|---|---|---|
| 6,207,494 | B1 | 3/2001 | Graimann et al. |
| 7,453,150 | B1 | 11/2008 | McDonald |
| 7,535,920 | B2 | 5/2009 | Robertson |
| 7,642,173 | B2 | 1/2010 | McDonald |
| 8,125,052 | B2 | 2/2012 | Jeng et al. |
| 8,153,521 | B2 | 4/2012 | Kang et al. |
| 8,158,515 | B2 | 4/2012 | Farooq et al. |
| 8,324,736 | B2 | 12/2012 | Kawashita et al. |
| 8,344,514 | B2 | 1/2013 | Cobbley et al. |
| 8,358,008 | B2 | 1/2013 | Wada et al. |
| 8,421,193 | B2 | 4/2013 | Huang |
| 8,525,345 | B2 | 9/2013 | Yen et al. |
| 8,592,991 | B2 | 11/2013 | Lee et al. |
| 8,643,074 | B2 | 2/2014 | Pai et al. |
| 8,692,382 | B2 | 4/2014 | Yen et al. |
| 8,729,711 | B2 | 5/2014 | Nishio |
| 9,006,804 | B2 | 4/2015 | Hung et al. |
| 9,041,206 | B2 | 5/2015 | Tsai et al. |
| 9,059,696 | B1 | 6/2015 | Rahman |
| 2002/0123219 | A1 | 9/2002 | Laverty et al. |
| 2006/0073695 | A1 | 4/2006 | Filippi |
| 2008/0284041 | A1* | 11/2008 | Jang ................ H01L 21/76898 257/774 |
| 2009/0014843 | A1 | 1/2009 | Kawashita et al. |
| 2009/0134432 | A1 | 5/2009 | Tabata et al. |
| 2010/0090317 | A1 | 4/2010 | Zimmermann et al. |
| 2010/0171196 | A1 | 7/2010 | Steadman et al. |
| 2010/0193964 | A1 | 8/2010 | Farooq et al. |
| 2010/0224876 | A1 | 9/2010 | Zhu |
| 2010/0238331 | A1 | 9/2010 | Umebayashi et al. |
| 2011/0062501 | A1 | 3/2011 | Soss et al. |
| 2011/0133339 | A1 | 6/2011 | Wang |
| 2011/0171582 | A1 | 7/2011 | Farooq et al. |
| 2011/0171827 | A1 | 7/2011 | Farooq et al. |
| 2011/0193197 | A1 | 8/2011 | Farooq et al. |
| 2011/0221070 | A1 | 9/2011 | Yen et al. |
| 2012/0038020 | A1 | 2/2012 | Lin et al. |
| 2012/0038028 | A1 | 2/2012 | Yaung et al. |
| 2012/0056323 | A1 | 3/2012 | Zhu |
| 2012/0056330 | A1 | 3/2012 | Lee et al. |
| 2012/0126394 | A1 | 5/2012 | Huang |
| 2012/0181698 | A1 | 7/2012 | Xie et al. |
| 2012/0193785 | A1 | 8/2012 | Lin et al. |
| 2012/0261827 | A1 | 10/2012 | Yu et al. |
| 2013/0009317 | A1 | 1/2013 | Hsieh et al. |
| 2013/0093098 | A1 | 4/2013 | Yang et al. |
| 2013/0140680 | A1 | 6/2013 | Harada et al. |
| 2013/0264688 | A1* | 10/2013 | Qian ................ H01L 21/76898 257/622 |
| 2013/0270625 | A1 | 10/2013 | Jang et al. |
| 2013/0292794 | A1 | 11/2013 | Pai et al. |
| 2014/0070426 | A1 | 3/2014 | Park et al. |
| 2014/0175653 | A1 | 6/2014 | Sandhu et al. |
| 2014/0247380 | A1 | 9/2014 | Hynecek |
| 2014/0264709 | A1 | 9/2014 | Tsai et al. |
| 2014/0264862 | A1 | 9/2014 | Tsai et al. |
| 2014/0264911 | A1 | 9/2014 | Lin et al. |
| 2014/0264947 | A1 | 9/2014 | Lin et al. |
| 2014/0361347 | A1* | 12/2014 | Kao ................ H01L 27/14687 257/226 |
| 2014/0361352 | A1 | 12/2014 | Hung et al. |
| 2015/0129942 | A1 | 5/2015 | Kao |
| 2015/0137238 | A1 | 5/2015 | Tsunemi et al. |
| 2015/0179613 | A1 | 6/2015 | Tsai et al. |
| 2015/0187701 | A1 | 7/2015 | Tsai et al. |
| 2015/0221695 | A1 | 8/2015 | Park et al. |
| 2015/0228584 | A1 | 8/2015 | Huang et al. |
| 2015/0243582 | A1 | 8/2015 | Klewer |
| 2016/0086997 | A1 | 3/2016 | Okamoto |

FOREIGN PATENT DOCUMENTS

| | | |
|---|---|---|
| CN | 102468279 A | 5/2012 |
| CN | 102867777 A | 1/2013 |
| CN | 103367348 A | 10/2013 |
| CN | 104051414 A | 9/2014 |
| JP | 2008305897 | 12/2008 |
| JP | 2010114165 A | 5/2010 |
| JP | 2013251511 A | 12/2013 |
| KR | 20100094905 A | 8/2010 |
| KR | 20130116607 | 10/2013 |
| KR | 20140000719 | 1/2014 |
| WO | 2011033601 | 3/2011 |
| WO | 2012006766 A1 | 1/2012 |

* cited by examiner

3DIC INTERCONNECT APPARATUS AND METHOD

This application is a continuation application of U.S. patent application Ser. No. 14/135,103, filed Dec. 19, 2013, entitled "3DIC Interconnect Apparatus and Method," which application is hereby incorporated herein in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

The present disclosure will be described with respect to embodiments in a specific context, namely, a method for forming interconnect structures for a stacked semiconductor device. Other embodiments, however, may be applied to a variety of semiconductor devices. Hereinafter, various embodiments will be explained in detail with reference to the accompanying drawings.

Figure 1:
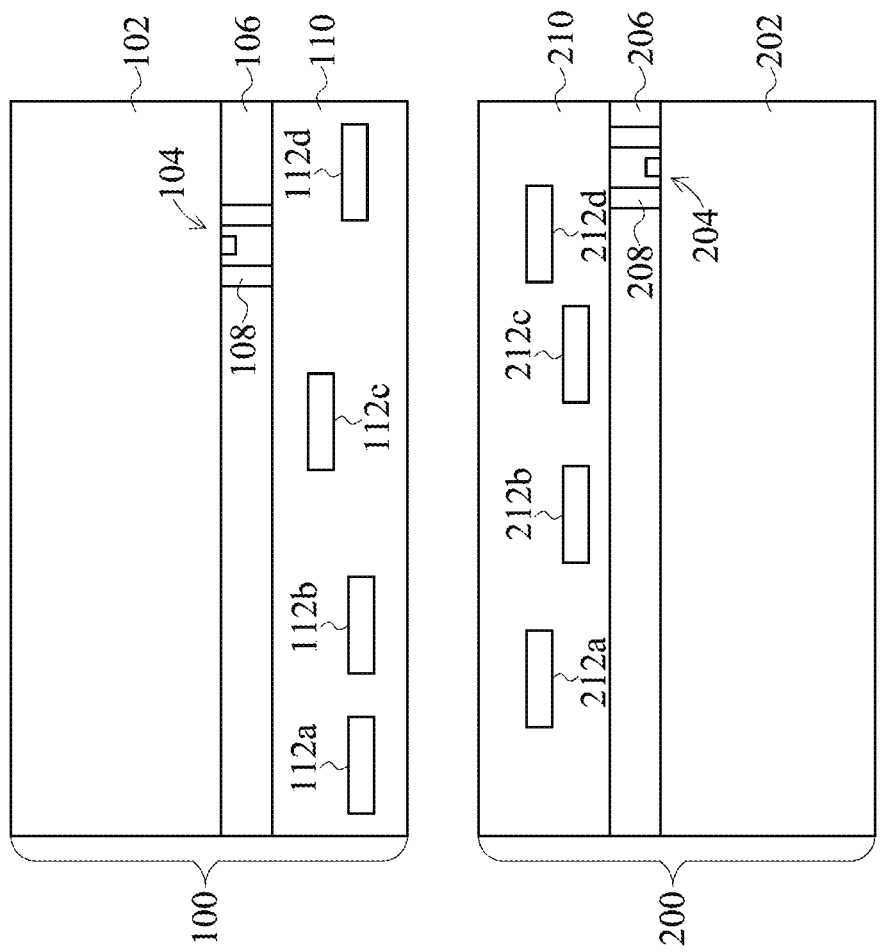
FIGS. 1-6 are cross-sectional views of various processing steps during fabrication of an interconnect in accordance with an embodiment.

FIGS. 1-6 illustrate various intermediate steps of forming an interconnect structure between two bonded wafers or dies in accordance with an embodiment. Referring first to FIG. 1, a first wafer 100 and a second wafer 200 is shown prior to a bonding process in accordance with various embodiments. In an embodiment, the second wafer 200 has similar features as the first wafer 100, and for the purpose of the following discussion, the features of the second wafer 200 having reference numerals of the form "2xx" are similar to features of the first wafer 100 having reference numerals of the form "1xx," the "xx" being the same numerals for the first substrate 102 and the second substrate 202. The various elements of the first wafer 100 and the second wafer 200 will be referred to as the "first <element> 1xx" and the "second <element> 2xx," respectively.

In an embodiment, the first wafer 100 comprises a first substrate 102 having a first electrical circuit (illustrated collectively by first electrical circuitry 104) formed thereon. The first substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The first electrical circuitry 104 formed on the first substrate 102 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the first electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is a first inter-layer dielectric (ILD)/inter-metallization dielectric (IMD) layer 106. The first ILD layer 106 may be formed, for example, of a low-K dielectric material, such as phosphosilicate glass (PSG), borophosphosilicate glass (BPSG), FSG, $SiO_xC_y$, Spin-On- Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the first ILD layer 106 may comprise a plurality of dielectric layers.

First contacts 108 are formed through the first ILD layer 106 to provide an electrical contact to the first electrical circuitry 104. The first contacts 108 may be formed, for example, by using photolithography techniques to deposit and pattern a photoresist material on the first ILD layer 106 to expose portions of the first ILD layer 106 that are to become the first contacts 108. An etch process, such as an anisotropic dry etch process, may be used to create openings in the first ILD layer 106. The openings may be lined with a diffusion barrier layer and/or an adhesion layer (not shown), and filled with a conductive material. The diffusion barrier layer comprises one or more layers of TaN, Ta, TiN, Ti, CoW, or the like, and the conductive material comprises copper, tungsten, aluminum, silver, and combinations thereof, or the like, thereby forming the first contacts 108 as illustrated in FIG. 1.

One or more additional ILD layers 110 and the first interconnect lines 112a-112d (collectively referred to as first interconnect lines 112) form metallization layers over the first ILD layer 106. Generally, the one or more additional ILD layers 110 and the associated metallization layers are used to interconnect the electrical circuitry to each other and to provide an external electrical connection. The additional ILD layers 110 may be formed of a low-K dielectric material, such as fluorosilicate glass (FSG) formed by PECVD techniques or high-density plasma chemical vapor deposition (HDPCVD) or the like, and may include intermediate etch stop layers. External contacts (not shown) may be formed in an uppermost layer.

It should also be noted that one or more etch stop layers (not shown) may be positioned between adjacent ones of the ILD layers, e.g., the first ILD layer 106 and the additional IMD layers 110. Generally, the etch stop layers provide a mechanism to stop an etching process when forming vias and/or contacts. The etch stop layers are formed of a dielectric material having a different etch selectivity from adjacent layers, e.g., the underlying first substrate 102 and the overlying ILD layers 106/110. In an embodiment, etch stop layers may be formed of SiN, SiCN, SiCO, CN, combinations thereof, or the like, deposited by CVD or PECVD techniques.

In an embodiment, the first wafer 100 is a backside illumination sensor (BIS) and the second wafer 200 is a logic circuit, such as an ASIC device. In this embodiment, the electrical circuitry 104 includes photo active regions, such as photo-diodes formed by implanting impurity ions into the epitaxial layer. Furthermore, the photo active regions may be a PN junction photo-diode, a PNP photo-transistor, an NPN photo-transistor or the like. The BIS sensor may be formed in an epitaxial layer over a silicon substrate.

The second wafer 200 may comprise a logic circuit, an analog-to-digital converter, a data processing circuit, a memory circuit, a bias circuit, a reference circuit, and the like.

In an embodiment, the first wafer 100 and the second wafer 200 are arranged with the device sides of the first substrate 102 and the second substrate 202 facing each other as illustrated in FIG. 1. As discussed in greater detail below, an opening will be formed extending from a backside (opposite the device side) of the first wafer 100 to the selected portions of the second interconnect lines 212 of the second wafer 200, such that portions of selected first interconnect lines 112 of the first wafer 100 will also be exposed. The opening will be subsequently filled with a conductive material, thereby forming an electrical contact on the backside of the first wafer to the interconnect lines of the first wafer 100 and the second wafer 200.

Figure 2:
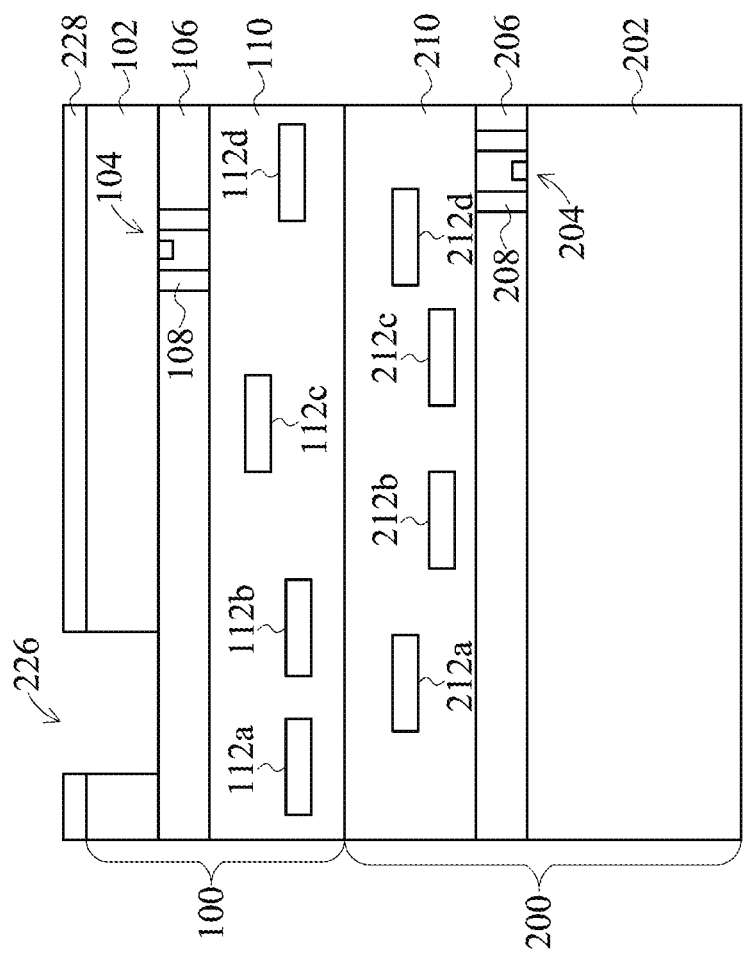

FIG. 2 illustrates the first wafer 100 and the second wafer 200 after bonding in accordance with an embodiment. As shown in FIG. 1, the first wafer 100 will be stacked and bonded on top of the second wafer 200. The first wafer 100 and the second wafer 200 may be bonded using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

It should be noted that the bonding may be at wafer level, wherein the first wafer 100 and the second wafer 200 are bonded together, and are then singulated into separated dies. Alternatively, the bonding may be performed at the die-to-die level, or the die-to-wafer level.

After the first wafer 100 and the second wafer 200 are bonded, a thinning process may be applied to the backside of the first wafer 100. In an embodiment in which the first substrate 102 is a BIS sensor, the thinning process serves to allow more light to pass through from the backside of the first substrate to the photo-active regions without being absorbed by the substrate. In an embodiment in which the BIS sensor is fabricated in an epitaxial layer, the backside of the first wafer 100 may be thinned until the epitaxial layer is exposed. The thinning process may be implemented by using suitable techniques such as grinding, polishing, a SMARTCUT® procedure, an ELTRAN® procedure, and/or chemical etching.

Also shown in FIG. 2 is a first opening 226. As discussed in greater detail below, an electrical connection will be formed extending from a backside of the first wafer 100 to select ones of the second interconnect lines 212 of the second wafer 200. The first opening 226 represents the opening in which the backside contact will be formed. The first opening 226 may be formed using photolithography techniques. Generally, photolithography techniques involve depositing a photoresist material, which is subsequently irradiated (exposed) and developed to remove a portion of the photoresist material. The remaining photoresist material protects the underlying material from subsequent processing steps, such as etching.

Also shown in FIG. 2 is an optional anti-reflection coating (ARC) layer 228. The ARC layer 228 reduces the reflection of the exposure light used during the photolithography process to pattern a patterned mask (not shown), which reflection may cause inaccuracies in the patterning. The ARC layer 228 may be formed of a nitride material (e.g., silicon nitride), an organic material (e.g., silicon carbide), an oxide material, high-k dielectric, and the like. The ARC layer 228 may be formed using suitable techniques such as CVD and/or the like.

Other layers may be used in the patterning process. For example, one or more optional hard mask layers may be used to pattern the first substrate 102. Generally, one or more hard mask layers may be useful in embodiments in which the etching process requires masking in addition to the masking provided by the photoresist material. During the subsequent etching process to pattern the first substrate 102, the patterned photoresist mask will also be etched, although the etch rate of the photoresist material may not be as high as the etch rate of the first substrate 102. If the etch process is such that the patterned photoresist mask would be consumed before the etching process is completed, then an additional hard mask may be utilized. The material of the hard mask layer or layers is selected such that the hard mask layer(s) exhibit a lower etch rate than the underlying materials, such as the materials of the first substrate 102.

Figure 3:
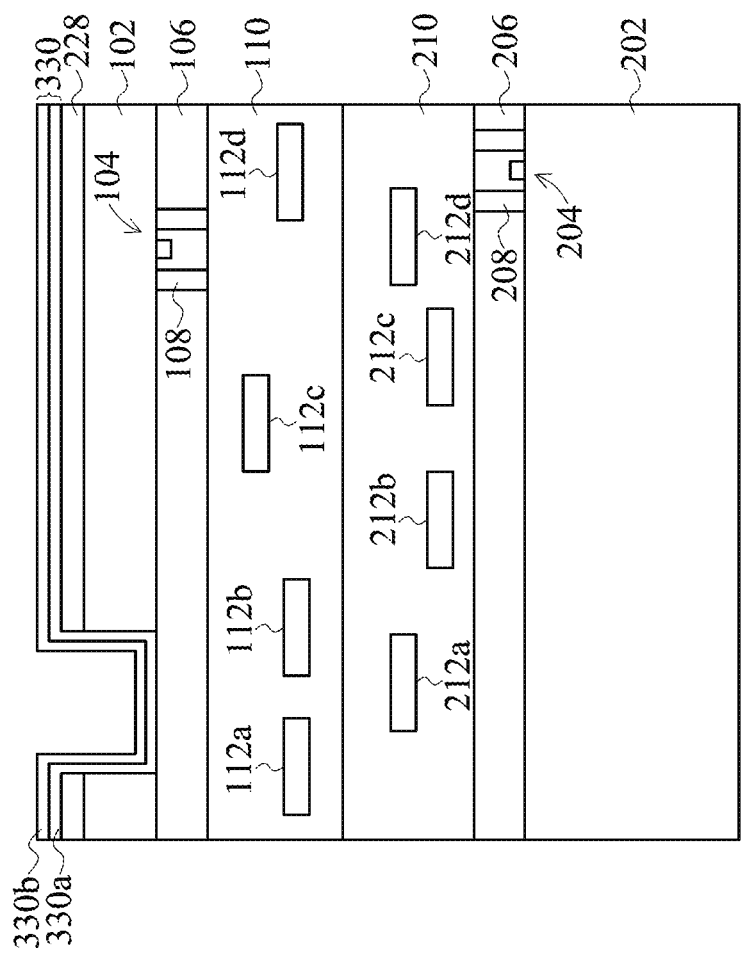

Referring now to FIG. 3, a multi-layered dielectric film 330 is formed over the backside of the first substrate 102 and along sidewalls of the first opening 226 in accordance with an embodiment. As will be discussed in greater detail below, the multi-layered dielectric film 330 provides greater passivation and isolation between through via structures and device circuits/pixel arrays. The multi-layered dielectric film 330 provides greater protection than a single film during, for example, a subsequent etch process to form electrical contacts to selected ones of the first interconnect structures 112 and the second interconnect structures 212. For example, an etch process such as a plasma etch may result in damage to the first substrate 102 as well as the dielectric layers (e.g., the ILD layers 106, 110, and 210). Additionally, the multi-layered dielectric film 330 may provide greater protection against metal ions diffusing into the first substrate 102 and the dielectric layers.

FIG. 3 illustrates an embodiment in which the multi-layered dielectric film 330 comprises a first dielectric film 330a and a second dielectric film 330b. The materials of the first dielectric film 330a and the second dielectric film 330b are selected such that there is a relatively high etch selectivity between the two layers. As discussed in greater detail below, an etch process will be performed to form spacer-shaped structures from the second dielectric film 330b on the first dielectric film 330a. An example of dielectric materials that may be used is a nitride material for the first dielectric film 330a and an oxide for the second dielectric film 330b. The nitride layer, such as a silicon nitride ($Si_3N_4$) layer, may be formed using CVD techniques using silane and ammonia as precursor gases, and deposition temperatures ranging from 550° to 900° Celsius (C.). The oxide layer, such as a silicon dioxide layer, may be formed by thermal oxidation or by CVD techniques using tetra-ethyl-ortho-silicate (TEOS) and oxygen as precursor. In an embodiment, the first dielectric film 330a has a thickness from about 200 Å to about 8,000 Å, and the second dielectric film 330b has a thickness from about 200 Å to about 8,000 Å. The thicknesses of the first dielectric film 330a and the second dielectric film 330b may be adjusted to provide sufficient protection, such as protection from the etch processes and/or isolation/passivation. Other materials, including other oxides, other nitrides, SiON, SiC, low k dielectric materials (e.g., Black Diamond), and/or high k oxides (e.g., $HfO_2$, $Ta_2O_5$).

Figure 4:
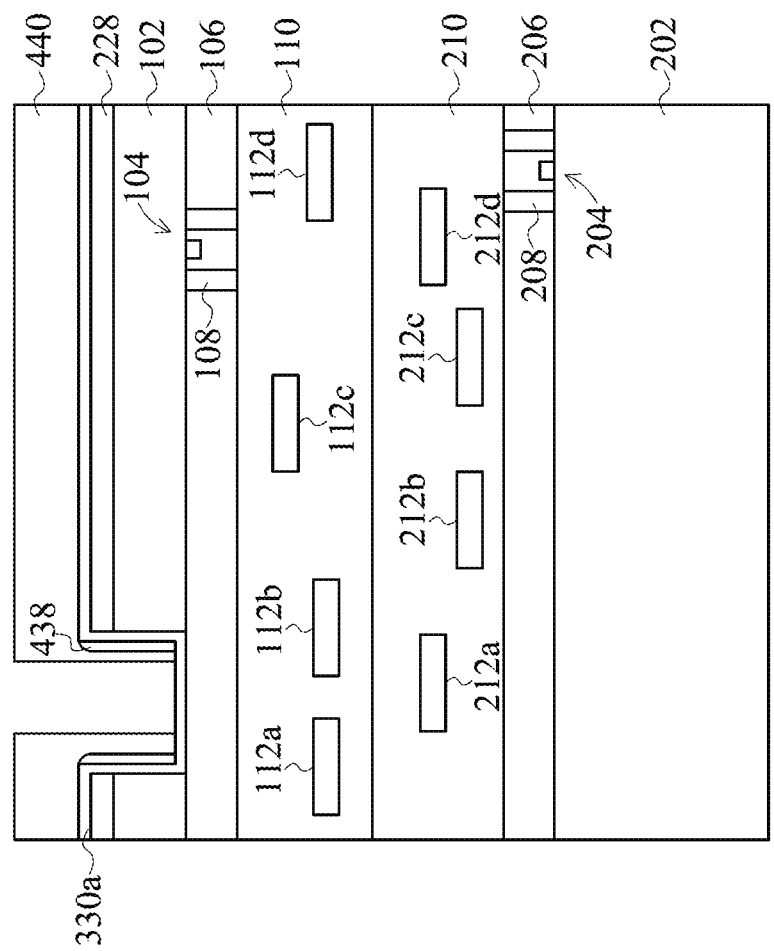

FIG. 4 illustrates forming spacer-shaped structures 438 from the second dielectric film 330b in accordance with an embodiment. In an embodiment in which the second dielectric film 330b is a silicon oxide layer, the spacer-shaped structures 438 may be formed using, for example, a dry etch process such that the second dielectric film 330b is etched while causing little or no damage to the silicon nitride material of the first dielectric film 330a. Other materials may be used.

FIG. 4 further illustrates a patterned mask 440 formed over the backside of the first substrate 102 in accordance with an embodiment. The patterned mask 440 may be, for example, a photoresist material that has been deposited, masked, exposed, and developed as part of a photolithography process. The patterned mask 440 is patterned to define a via opening extending through the one or more ILD layers 110 of the first substrate 102 and at least some of the one or more ILD layers 210 of the second substrate 202, thereby exposing portions of select ones of the first interconnect lines 112 and the second interconnect lines 212, as explained in greater detail below.

Figure 5:
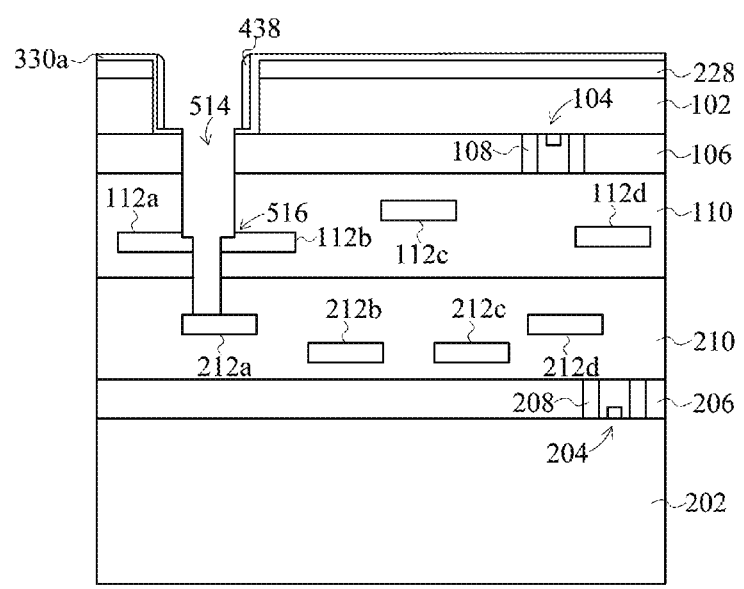

FIG. 5 illustrates the semiconductor device shown in FIG. 4 after one or more additional etching processes are performed in accordance with an embodiment. A suitable etching process, such as a dry etch, an anisotropic wet etch, or any other suitable anisotropic etch or patterning process, may be performed on the semiconductor device to form a second opening 514.

As illustrated in FIG. 5, the second opening 514 extends the first opening 226 to the first interconnect lines 112a and 112b and to the second interconnect line 212a. In an embodiment, the first interconnect lines 112a and 112b are formed of suitable metal materials such as copper, which exhibits a different etching rate (selectivity) than the first ILD layers 110. As such, the first interconnect lines 112a and 112b function as a hard mask layer for the etching process of the first ILD layers 110. A selective etching process may be employed to etch the first ILD layers 110 rapidly while etching only a portion of the first interconnect lines 112a and 112b. As shown in FIG. 5, the exposed portion of the first interconnect lines 112a and 112b may be partially etched away, thereby forming a recess 516, as the etch process continues toward the second interconnect line 212a. The depth of the recess 516 may vary depending on a variety of applications and design needs.

The second etch process continues until the second interconnect line 212a is exposed, thereby forming a combined opening extending from a backside of the first wafer 100 to the second interconnect line 212a of the second wafer 200 as illustrated in FIG. 5.

It should be noted that the second etch process may extend through a variety of various layers used to form the first ILD layers 110 and the second ILD layers 210, which may include various types of materials and etch stop layers. Accordingly, the second etch process may utilize multiple etchants to etch through the various layers, wherein the etchants are selected based upon the materials being etched.

Figure 6:
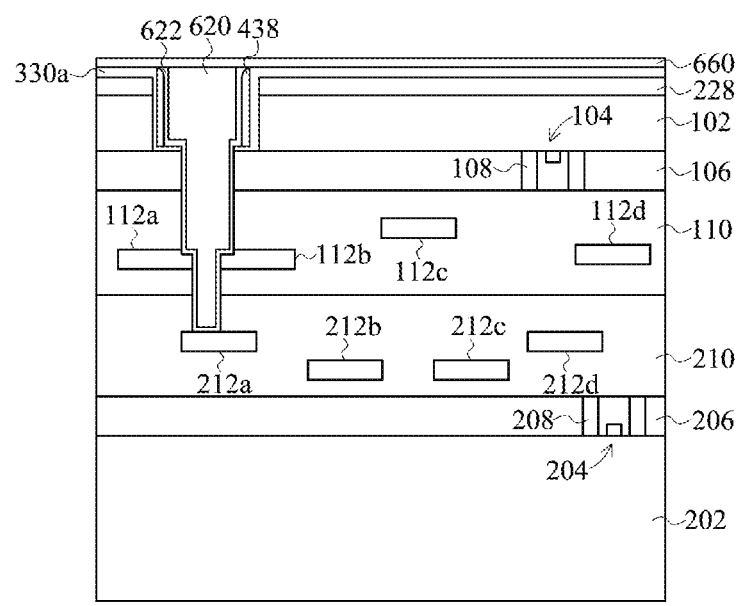

FIG. 6 illustrates a conductive material formed within the first opening 310 and the second opening 514 in accordance with various embodiments. In an embodiment, the conductive material may be formed by depositing one or more diffusion and/or barrier layers 622 and depositing a seed layer. For example, a diffusion barrier layer comprising one or more layers of Ta, TaN, TiN, Ti, CoW, or the like is formed along the sidewalls of the first opening 310 and the second opening 514. The seed layer (not shown) may be formed of copper, nickel, gold, any combination thereof and/or the like. The diffusion barrier layer and the seed layer may be formed by suitable deposition techniques such as PVD, CVD and/or the like. Once the seed layer has been deposited in the openings, a conductive material, such as tungsten, titanium, aluminum, copper, any combinations thereof and/or the like, is filled into the first opening 310 and the second opening 514, using, for example, an electro-chemical plating process, thereby forming a conductive plug 620.

FIG. 6 also illustrates removal of excess materials, e.g., excess conductive materials, from the backside of the first substrate 102. In embodiments, one or more of the layers of the multi-layer dielectric film 330 may be left along a backside of the first substrate 102 to provide additional protection from the environment. In the example illustrated in FIG. 6, the first dielectric film 330a of the multi-layer dielectric film 330 remains. In this example, the excess materials may be removed using an etch process, a planarization process (e.g., a CMP process), or the like, using the first dielectric film 330a as a stop layer.

FIG. 6 further illustrates a dielectric capping layer 660 formed along a backside of the first wafer 100. The dielectric capping layer 660 may comprise one or more layers of dielectric materials, such as silicon nitride, silicon oxynitride, silicon oxycarbide, silicon carbide, combinations thereof, and multi-layers thereof. The dielectric capping layer 660 may have a thickness from about 200 Å to about 6,000 Å, and be formed by, for example, using suitable deposition techniques such as sputtering, CVD and the like.

Figure 7:
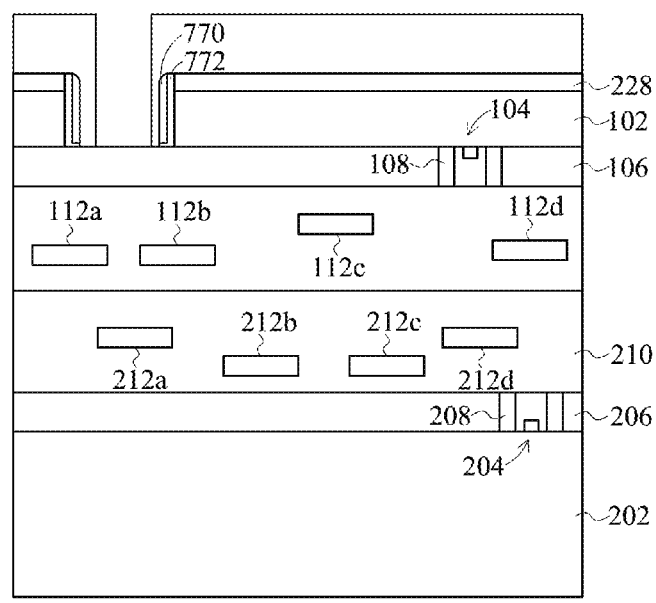
FIGS. 7-9 are cross-sectional views of various processing steps during fabrication of an interconnect in accordance with another embodiment.
Figure 8:
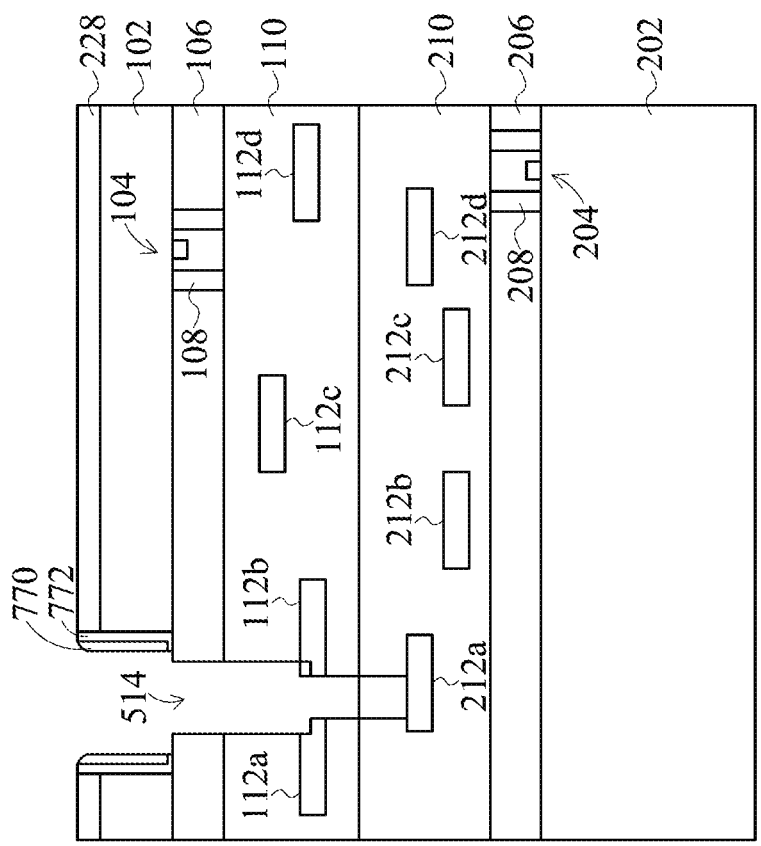
Figure 9:
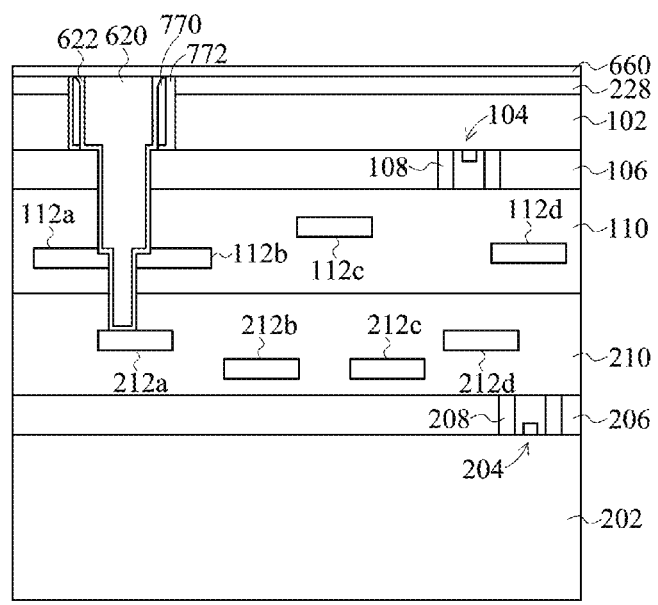

FIGS. 7-9 illustrate another embodiment of forming multi-layered dielectric film along sidewalls of the first opening 226. FIGS. 7-9 assume a process similar to that discussed above with reference to FIGS. 1-3 have been formed. Accordingly, FIG. 7 illustrates the structure of FIG. 3, after the first dielectric film 330a and the second dielectric film 330b of the multi-layered dielectric film 330 have been etched to form multiple spacer-shaped structures. Whereas FIG. 4 discussed above etched only a subset of the dielectric layers, the embodiment illustrated in FIG. 7 performs an etch process on all of the films of the multi-layered dielectric film.

In this embodiment in which two dielectric films are used, both films are subjected to an etch process, resulting in a series of spacer-shaped structures along sidewalls of the first opening 226. In an embodiment in which the second dielectric film 330b comprises silicon oxide, a dilute hydrofluoric acid may be used to form spacer-shaped structures 770 on the first dielectric film 330a (similar to that illustrated in FIG. 4) from the second dielectric film 330b. A second etch process may then be used to etch the first dielectric film 330a. For example, in an embodiment in which the first dielectric film 330a comprises a silicon nitride, a phosphoric acid may be used to etch the first dielectric film 330a to form spacer-shaped structures 772. As a result, multiple spacer-shaped structures, such as the spacer-shaped structures 770 and 772 of FIG. 7, are formed along sidewalls of the first opening 226.

FIG. 8 illustrates formation of the second opening 514 in accordance with an embodiment. Similar processes as discussed above with reference to FIG. 5 may be used, except in the current embodiment, the first dielectric film 330a is no longer present along the bottom surface of the first opening 310, and hence there is no need to etch through the first dielectric film 330a as part of the etch process.

FIG. 9 illustrates the structure after forming barrier layer 622, filling the first opening 226 and the second opening 514 with a conductive material, and forming a capping layer 660. Processes similar to those discussed above with reference to FIG. 6 may be used. As illustrated in FIG. 9, as a result of the etch process to form the spacer-shaped structure 772, the first dielectric film 330a does not extend over the surface of the first substrate 102 or optional ARC layer 228 as shown in FIG. 6.

Figure 10:
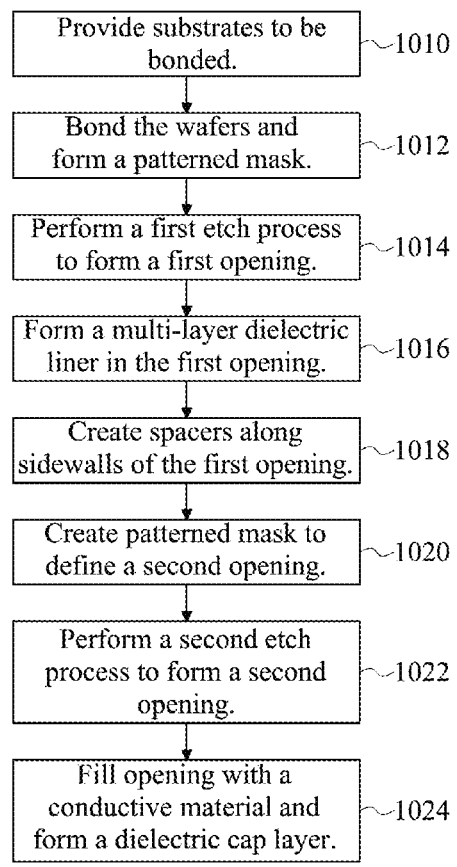
FIG. 10 is a flow diagram illustrating a method of forming an interconnect in accordance with an embodiment.

FIG. 10 is a flowchart illustrating a method of forming stacked chip configuration in accordance with an embodiment. The method begins in step 1010, wherein substrates to be bonded are provided. The substrates may be processed wafers (such as those illustrated in FIG. 1), dies, a wafer and a die, or the like. In step 1012, the substrates are bonded and a patterned mask is formed thereon, the patterned mask defining an opening for a contact plug to be subsequently formed, such as that discussed above with reference to FIG. 2. Optionally, an ARC layer and/or one or more hard mask layers are formed.

Thereafter, in step 1014, a first etch process is performed to etch through a first substrate of the first wafer, such as discussed above with reference to FIG. 3, thereby forming a first opening. In step 1016, a multi-layer dielectric film is formed within the first opening and along a backside of the first substrate, and in step 1018, an etch process is performed to etch one or more layers of the multi-layer dielectric film to create spacer-like structures along sidewalls of the first opening. In one embodiment, less than all of the films of the multi-layer dielectric film is etched, such as that discussed above with reference to FIG. 4, and in another embodiment, all of the films of multi-layer dielectric film are etched, creating multiple spacer-shaped structures, as discussed above with reference to FIG. 7.

A patterned mask, as discussed above with reference to FIGS. 4 and 7, is formed to define a second opening to contact select ones of the interconnects formed on the first substrate and/or the second substrate in step 1020. In step 1022, another etch process is used to create the second opening, which exposes portions of the interconnects on the first substrate and/or the second substrate, as discussed above with reference to FIGS. 5 and 8. The opening is filled with a conductive material in step 1024, such as that discussed above with reference to FIGS. 6 and 9. A dielectric cap layer may be formed over the conductive material, such as that discussed above with reference to FIGS. 6 and 9.

In an embodiment, an apparatus is provided. The apparatus includes a first chip and a second chip. The first chip has a first substrate, a plurality of first dielectric layers and a plurality of first metal lines formed in the first dielectric layers over the first substrate. The second chip has a surface bonded to a first surface of the first semiconductor chip, wherein the second chip has a second substrate, a plurality of second dielectric layers and a plurality of second metal lines formed in the second dielectric layers over the second substrate. A conductive plug extends from a second surface of the first chip to one of the plurality of second metal lines in the second semiconductor chip. A plurality of liners are interposed between the conductive plug and the first substrate, such that at least one of the plurality of liners does not extend between the conductive plug and the plurality of first dielectric layers.

In another embodiment, a method is provided. The method includes providing a first chip, wherein the first chip has a substrate and a plurality of dielectric layers, the plurality of dielectric layers having metallization layers formed therein. A first surface of the plurality of dielectric layers of the first chip is bonded to a surface of a second chip. A first opening extending from a backside of the substrate to the plurality of dielectric layers is formed, and a plurality of liners are formed along sidewalls of the first opening. A second opening extending from a bottom of the first opening through the plurality of dielectric layers to a metallization layer in the second chip is formed, and a conductive material is formed in the first opening and the second opening.

In yet another embodiment, another method is provided. The method includes providing a bonded structure having a first substrate bonded to a second substrate, the first substrate having one or more overlying first dielectric layers and a first conductive interconnect in the one or more first dielectric layers, the second substrate having one or more overlying second dielectric layers and a second conductive interconnect in the one or more second dielectric layers, the first substrate being bonded to the second substrate such that the first dielectric layers face the second dielectric layers. A first opening is formed extending through the first substrate, and a plurality of dielectric layers are formed along sidewalls of the first opening. After the forming the plurality of dielectric layers, a second opening is formed extending from the first opening to a first pad formed in at least one of the first dielectric layers and a second pad formed in at least one of the second dielectric layers. A conductive plug is formed in the first opening and the second opening.

In yet another embodiment, a method is provided. The method includes bonding a first chip to a second chip, the first chip comprising a first substrate having one or more first dielectric layers overlying the first substrate and a first conductive interconnect in the one or more first dielectric layers, the second chip comprising a second substrate having one or more second dielectric layers overlying the second substrate and a second conductive interconnect in the one or more second dielectric layers, the first chip being bonded to the second chip such that the first dielectric layers face the second dielectric layers. The method further includes forming a first opening extending through the first substrate, forming a multi-layer dielectric film along sidewalls of the first opening and a backside surface of the first substrate, a first dielectric film of the multi-layer dielectric film contacting the first substrate and a second dielectric film of the multi-layer dielectric film contacting the first dielectric film, and etching the second dielectric film to form spacer-shaped structures along the sidewalls of the opening, uppermost ends of the spacer-shaped structures extending no higher than an uppermost surface of the first dielectric film. The method further includes after forming the spacer-shaped structures, forming a second opening to the first conductive interconnect and to the second conductive interconnect thereby forming a combined opening in the first chip and the second chip, and filling the combined opening with a conductive material.

In yet another embodiment, an apparatus is provided. The apparatus includes a first chip bonded to a second chip, the first chip having a first substrate, the first substrate having a backside and an active side, the first chip having a first interconnect in one or more first dielectric layers on the active side of the first substrate, the second chip having a second substrate, the second substrate having a backside and an active side, the second chip having a second interconnect in one or more second dielectric layers on the active side of the second substrate, the one or more first dielectric layers and the one or more second dielectric layers being interposed between the first substrate and the second substrate, and a conductive plug extending through a first opening in the first substrate and a second opening in the one or more first dielectric layers, the conductive plug electrically coupled to the second interconnect, the conductive plug having a first width in the first substrate and a second width in the one or more first dielectric layers, the first width being greater than the second width. The apparatus further includes a plurality of liners interposed between the conductive plug and the first substrate, sidewalls of the one or more first dielectric layers being free of the plurality of liners, a surface of the conductive plug being level with a surface of a first liner of the plurality of liners.

In yet another embodiment, an apparatus is provided. The apparatus includes a first chip bonded to a second chip, the first chip having a first substrate, the first substrate having a backside and an active side, the first chip having a first interconnect in one or more first dielectric layers on the active side of the first substrate, the second chip having a second substrate, the second substrate having a backside and an active side, the second chip having a second interconnect in one or more second dielectric layers on the active side of the second substrate, the one or more first dielectric layers and the one or more second dielectric layers being interposed between the first substrate and the second substrate, the first substrate having a first opening, the one or more first dielectric layers having a second opening extending from the first substrate to the first interconnect, the one or more first dielectric layers having a third opening extending from the first interconnect to the second interconnect. The apparatus further includes a first liner extending along a sidewall of the first substrate in the first opening, the second opening being free of the first liner, a second liner extending along sidewalls of the first liner, and a conductive plug in the first opening, the second opening, and the third opening, the conductive plug being electrically coupled to the first interconnect and the second interconnect, the first liner and the second liner being interposed between the conductive plug and the first substrate.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A method comprising:
bonding a first chip to a second chip, the first chip comprising a first substrate having one or more first dielectric layers overlying the first substrate and a first conductive interconnect in the one or more first dielectric layers, the second chip comprising a second substrate having one or more second dielectric layers overlying the second substrate and a second conductive interconnect in the one or more second dielectric layers, the first chip being bonded to the second chip such that the first dielectric layers face the second dielectric layers;
forming a first opening extending through the first substrate;
forming a multi-layer dielectric film along sidewalls of the first opening and a backside surface of the first substrate, a first dielectric film of the multi-layer dielectric film contacting the first substrate and a second dielectric film of the multi-layer dielectric film contacting the first dielectric film;
etching the second dielectric film to form spacer-shaped structures along the sidewalls of the opening, uppermost ends of the spacer-shaped structures extending no higher than an uppermost surface of the first dielectric film;

after forming the spacer-shaped structures, forming a patterned mask over the spacer-shaped structures and the first dielectric film and forming a second opening to the first conductive interconnect and to the second conductive interconnect using the patterned mask as a mask thereby forming a combined opening in the first chip and the second chip; and filling the combined opening with a conductive material.

2. The method of claim 1, wherein, prior to forming the patterned mask, performing an etch to remove a portion of the first dielectric film using the spacer-shaped structures as an etch mask.

3. The method of claim 2, wherein after performing the etch to remove the portion of the first dielectric film:

forming the patterned mask over the spacer-shaped structures and the first dielectric film, the patterned mask having a third opening within the first opening; and performing an etch to form the second opening.

4. The method of claim 1, wherein forming the second opening comprises:

performing an etch to remove a portion of the first dielectric film, wherein after the etch to remove a portion of the first dielectric film, the first dielectric film extends along a bottom of the first opening away from the spacer-shaped structures.

5. The method of claim 1, further comprising forming a liner in the first opening and the second opening.

6. The method of claim 5, further comprising planarizing the liner such that surfaces of the first dielectric film and the liner are level.

7. The method of claim 6, further comprising forming a coating on the first substrate prior to forming the first opening.

8. The method of claim 1, wherein after filling the combined opening with a conductive material, the first dielectric film remains over the backside surface of the first substrate.

9. An apparatus comprising:

a first chip bonded to a second chip, the first chip having a first substrate, the first substrate having a backside and an active side, the first chip having a first interconnect in one or more first dielectric layers on the active side of the first substrate, the second chip having a second substrate, the second substrate having a backside and an active side, the second chip having a second interconnect in one or more second dielectric layers on the active side of the second substrate, the one or more first dielectric layers and the one or more second dielectric layers being interposed between the first substrate and the second substrate;

a conductive plug extending through a first opening in the first substrate and a second opening in the one or more first dielectric layers, the conductive plug electrically coupled to the second interconnect, the conductive plug having a first width in the first substrate and a second width in the one or more first dielectric layers, the first width being greater than the second width; and a plurality of liners interposed between the conductive plug and the first substrate, sidewalls of the one or more first dielectric layers being free of the plurality of liners, a surface of the conductive plug being level with a surface of a first liner of the plurality of liners, wherein the plurality of liners comprises a first liner contacting the first substrate and a second liner on the first liner, the first liner and the second liner being coterminous, the first liner not extending to the second opening.

10. The apparatus of claim 9, further comprising a barrier layer interposed between the conductive plug and the one or more first dielectric layers and between the conductive plug and the one or more second dielectric layers.

11. The apparatus of claim 9, wherein the conductive plug is electrically coupled to the first interconnect.

12. The apparatus of claim 11, wherein the conductive plug extends into a recess of the first interconnect.

13. The apparatus of claim 9, further comprising a dielectric layer over a surface of the first substrate, the first substrate being interposed between the dielectric layer and the one or more first dielectric layers, the conductive plug extending through the dielectric layer, the surface of the conductive plug being level with a surface of the dielectric layer.

14. The apparatus of claim 9, wherein the surface of the conductive plug is level with a surface of a second liner of the plurality of liners.

15. The apparatus of claim 9, further comprising a barrier layer in the first opening and the second opening, the barrier layer interposed between the conductive plug and the one or more first dielectric layers, wherein the first liner contacts the barrier layer.

16. An apparatus comprising:

a first chip bonded to a second chip, the first chip having a first substrate, the first substrate having a backside and an active side, the first chip having a first interconnect in one or more first dielectric layers on the active side of the first substrate, the second chip having a second substrate, the second substrate having a backside and an active side, the second chip having a second interconnect in one or more second dielectric layers on the active side of the second substrate, the one or more first dielectric layers and the one or more second dielectric layers being interposed between the first substrate and the second substrate, the first substrate having a first opening, the one or more first dielectric layers having a second opening extending from the first substrate to the first interconnect, the one or more first dielectric layers having a third opening extending from the first interconnect to the second interconnect;

a first liner extending along a sidewall of the first substrate in the first opening, the second opening being free of the first liner;

a second liner extending along sidewalls of the first liner;

a conductive plug in the first opening, the second opening, and the third opening, the conductive plug being electrically coupled to the first interconnect and the second interconnect, the first liner and the second liner being interposed between the conductive plug and the first substrate; and a barrier layer in the first opening, the second opening, and the third opening, the barrier layer interposed between the conductive plug and the one or more first dielectric layers, wherein the first liner contacts the barrier layer.

17. The apparatus of claim 16, wherein the first opening has a first width and the second opening has a second width less than the first width forming a ledge between the first opening and the second opening.

18. The apparatus of claim 17, wherein the first liner extends from a sidewall of the first opening to the second opening.

19. The apparatus of claim 17, wherein the first liner and the second liner are spaced apart from the second opening a same distance.

20. The apparatus of claim 16, wherein the first liner extends over the backside of the first substrate.

* * * * *